(12) United States Patent
Gui et al.

(10) Patent No.: US 7,477,403 B2
(45) Date of Patent: Jan. 13, 2009

(54) OPTICAL POSITION ASSESSMENT APPARATUS AND METHOD

(75) Inventors: Cheng-Qun Gui, Best (NL); Fransiscus Godefridus Casper Bijnen, Valkenswaard (NL); Johan Christiaan Gerard Hoefnagels, Hooge Mierde (NL); Pieter Willem Herman de Jager, Rotterdam (NL); Joannes Theodoor de Smit, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 433 days.

(21) Appl. No.: 10/854,770

(22) Filed: May 27, 2004

(65) Prior Publication Data

US 2005/0275840 A1    Dec. 15, 2005

(51) Int. Cl.
*G01B 11/14*  (2006.01)
*G01B 11/00*  (2006.01)
*G03B 27/32*  (2006.01)
*G03F 9/00*   (2006.01)
*G03C 5/00*   (2006.01)

(52) U.S. Cl. .................. 356/614; 356/400; 356/401; 355/77; 430/22; 430/30

(58) Field of Classification Search .............. None
See application file for complete search history.

(56) References Cited

U.S. PATENT DOCUMENTS 5,229,872 A    7/1993   Mumola
5,296,891 A    3/1994   Vogt et al.
5,500,736 A    3/1996   Koitabashi et al.

(Continued)

FOREIGN PATENT DOCUMENTS

EP         1 482 375 A2    12/2004

(Continued)

OTHER PUBLICATIONS

Office Action for Japanese Application No. JP 2005-153230 mailed Jul. 1, 2008, 3pgs.

(Continued)

*Primary Examiner*—Gregory J Toatley, Jr.
*Assistant Examiner*—Gordon J Stock, Jr.
(74) *Attorney, Agent, or Firm*—Sterne, Kessler, Goldstein & Fox P.L.L.C

(57) ABSTRACT

An optical position assessment apparatus and method has an illumination system that supplies an alignment beam of radiation, and positional data is derived from reflections of the alignment beam. A substrate is supported on a substrate table and a projection system is used to project the alignment beam onto a target portion of the substrate. A positioning system causes relative movement between the substrate and the projection system. An array of lenses is arranged such that each lens in the array focuses a respective portion of the alignment beam onto a respective part of the target portion. An array of detectors is arranged such that each detector in the array detects light reflected from the substrate through a respective lens in the array and provides an output representative of the intensity of light reflected to it from the substrate through the respective lens. A processor is connected to the outputs of the detectors for deriving data representing the position of the lens array relative to the substrate from the outputs of the detectors.

44 Claims, 14 Drawing Sheets

U.S. PATENT DOCUMENTS

| | | | |
|---|---|---|---|
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,628,390 B1 * | 9/2003 | Johnson | 356/400 |
| 6,671,048 B1 * | 12/2003 | Leroux | 356/401 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2005/0179882 A1 * | 8/2005 | Gui et al. | 355/55 |
| 2005/0200820 A1 * | 9/2005 | Gui | 355/67 |

FOREIGN PATENT DOCUMENTS

| | | |
|---|---|---|
| JP | 11-260712 A | 9/1999 |
| WO | WO 97/034171 A2 | 9/1997 |
| WO | WO 98/33096 A1 | 7/1998 |
| WO | WO 98/38597 A2 | 9/1998 |
| WO | WO 98/38597 A3 | 9/1998 |

OTHER PUBLICATIONS

English Abstract for JP 2001-500628 published Jan. 16, 2001, 1 pg.

* cited by examiner

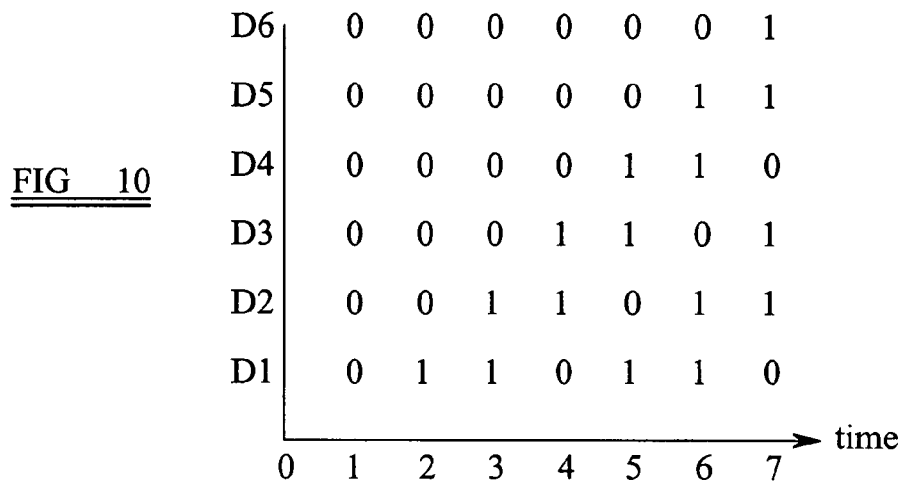
FIG 10
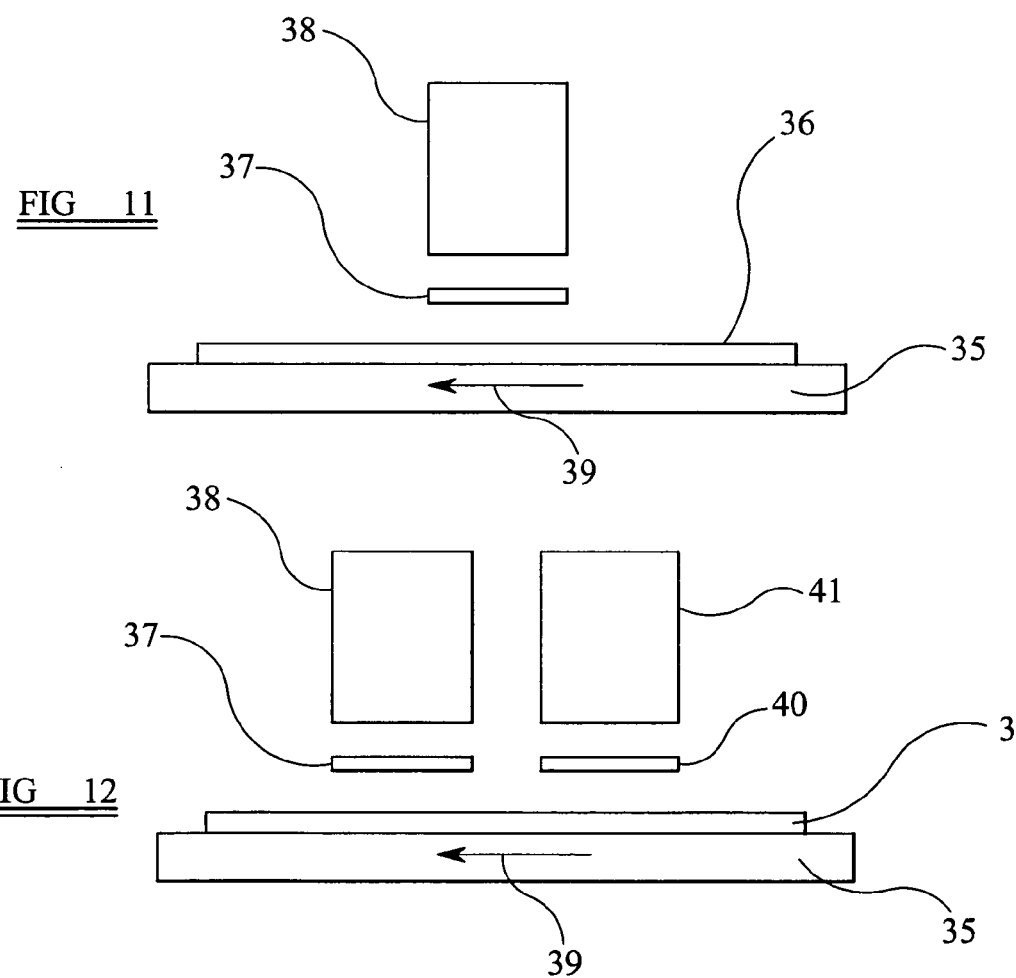
FIG 11
FIG 12

OPTICAL POSITION ASSESSMENT APPARATUS AND METHOD

BACKGROUND OF THE INVENTION

1. Field of the Invention

The present invention relates to an optical position assessment apparatus and method which may be used in lithographic apparatus.

2. Background Art

A lithographic apparatus is a machine that applies a desired pattern onto a target portion of a substrate. Lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (e.g., resist). Instead of a mask, the patterning means may comprise an array of individually controllable elements which serve to generate the circuit pattern.

In general, a single substrate will contain a network of adjacent target portions that are successively exposed. Known lithographic apparatus include steppers, in which each target portion is irradiated by exposing an entire pattern onto the target portion in one pass, and scanners, in which each target portion is irradiated by scanning the pattern through the projection beam in a given direction (the "scanning" direction), while synchronously scanning the substrate parallel or anti-parallel to this direction.

It will be appreciated that, whether or not a lithographic apparatus operates in stepping or scanning mode, it is vital that the patterned beam is directed onto the appropriate target portion of the substrate surface. In many circumstances multilayer structures are built up on the surface of the substrate as a result of a sequence of lithographic processing steps. It is of course vital that the successive layers formed in the substrate are correctly in register with each other. Thus, great care is taken to ensure that the position of the substrate relative to the beam projection system is accurately known.

Various techniques are used to determine the position of a substrate relative to the beam projection system. Generally, the substrate has formed upon it alignment marks that are arranged around the periphery of areas of the substrate onto which active circuit components or the like are to be formed. These marks are located to provide reference points relative to which the position of target portions on the substrate are determined. Ideally, the alignment marks are detected optically using the beam projection system, which is also used to project patterns onto the substrate. Such a "through the lens" or TTL approach to the problem of locating alignment marks has the advantage that the position measurement location is the same as the image formation location. Thus errors are minimized.

Position determining accuracy, which term is used to include x, y offset, rotation, and magnifications etc., is a function of the spacing between alignment marks. The smaller that spacing the better, as it reduces the extent to which accuracy depends upon the accuracy of control of movements of the substrate relative to the beam projection system. There are circumstances, however, where it is difficult to avoid large spacings between alignment marks. For example, large liquid crystal display (LCD) panels are now envisaged with diagonal sizes (generally quoted in inches, e.g., 32, 42, 60 inches etc.) resulting in edge dimensions of the order of one meter. All of the surface of such a device is occupied by active components and therefore there is no space available for alignment marks except around the periphery of the panels. This means that the spacing between the alignment marks is of the same order as the edge dimension of the panel. This makes it very difficult to maintain positional accuracy across the whole of the area of the panel.

Conventionally, a lithographic apparatus delivers a projection beam to the substrate through a lens assembly in which each of the lenses is arranged in series along the beam projection direction. The lens component closest to the substrate is a single lens through which all of the projection beam passes. It has been proposed, however, to use an alternative design approach in which again a series of lenses are arranged along the projection beam path, but the lens component closest to the substrate is in the form of a two dimensional array of small lenses. Each of those small lenses focuses a respective part of the projection beam onto a respective part of the substrate. Systems in accordance with this alternative design are generally referred to as microlens array imaging systems or MLA systems. In MLA systems, it has not been possible to use conventional "through the lens" approaches to the detection of alignment marks on a substrate to be exposed. As a result, it has been considered necessary to provide separate metrology systems for alignment purposes.

Therefore, what is needed is an improved position assessment (measuring) apparatus and method which can be used in a microlens array imaging system.

BRIEF SUMMARY OF THE INVENTION

The present invention includes an optical position assessment apparatus and method in which an illumination system supplies an alignment beam of radiation, a substrate table supports a substrate, a projection system projects the alignment beam onto a target portion of the substrate supported on the substrate table, a positioning system causes relative movement between a substrate supported on the substrate table and the projection system, and a measurement system determines the position of at least a component of the projection system relative to the substrate. The measurement system comprises an array of lenses arranged such that each lens in the array focuses a respective portion of the alignment beam onto a respective part of the target portion, an array of detectors arranged such that each detector in the array detects light reflected from the substrate through a respective lens in the array and provides an output representative of the intensity of light reflected to it from the substrate through the respective lens, and a processor connected to the outputs of the detectors for deriving data representing the position of the lens array relative to the substrate from the outputs of the detectors.

In this embodiment, the microlens array is used both to project a patterned beam onto a substrate and to detect alignment marks on the substrate. Thus, a "through the lens" alignment apparatus and method is provided in the context of a microlens array imaging system.

The outputs of the detector array may be processed to determine characteristics of regions of the substrate beneath the lens array that have different reflectivities. Those regions may be in the form of alignment marks provided on the substrate surface purely for alignment purposes or surface formations that have been formed to provide device functionality, but the position of which must be accurately known for subsequent processing steps to be efficiently performed.

The processor may be arranged to derive an intensity pattern corresponding to the detected intensities of the regions of the substrate beneath the lens array, to compare the derived intensity pattern with a stored intensity pattern corresponding to an alignment pattern to be detected on the substrate, and to determine the position of the substrate relative to the lens array from the position of lenses within the lens array from which a pattern is derived which is the same as the stored pattern. Thus, the system can be set up to "search" for a pattern, the characteristics of which are determined in advance. Once the pattern which is searched for has been located, its position can be accurately determined from the position of the lenses in the microlens array that contribute to that located pattern. On the other hand, if a pattern which is being searched for is not located, this can be taken as an indication that there is a fault. For example, if the system is set up to search for a pattern corresponding to a pattern formed in, for example, a resist during a previous processing step, the absence of such a pattern would indicate a failure in that previous processing step and further processing of the device could be terminated.

Separate illumination sources can be provided, one for providing a projection beam used, for example, to expose a substrate and the other to provide a projection beam which is used for alignment purposes. The illumination sources may produce beams of different wavelengths so that the alignment beam does not affect, for example, the exposure of a resist which is scanned by the alignment beam. Alternatively, exposure and alignment beams may be generated from a common source. The exposure and alignment beams may be projected through a single common lens system or through separate systems. The alignment beam could be projected onto a peripheral section of a single microlens array onto which the exposure beam is also projected.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

Figure 7:
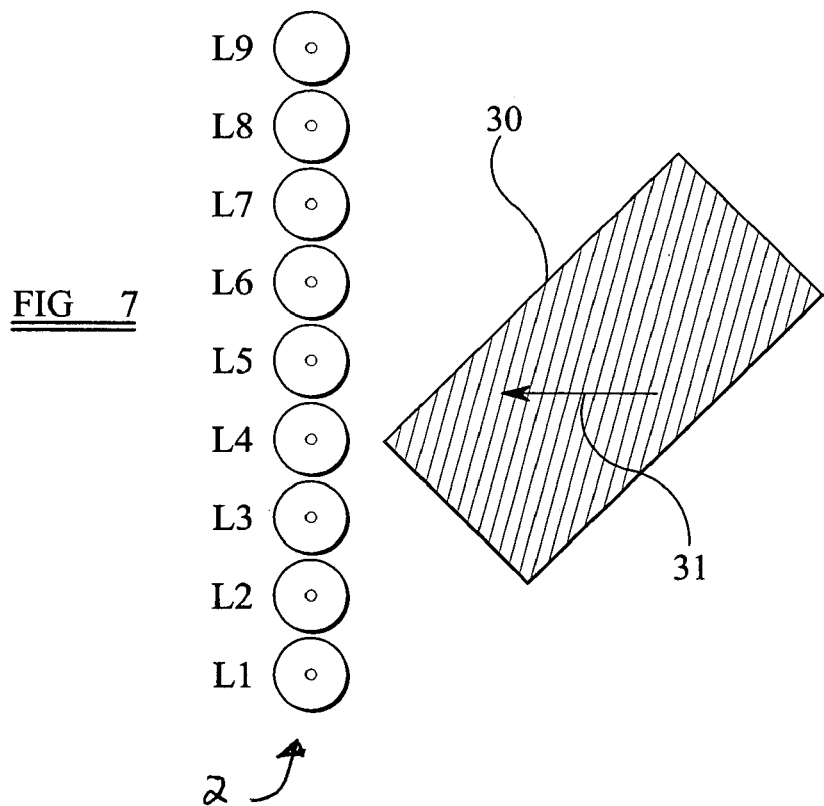
Figure 8:
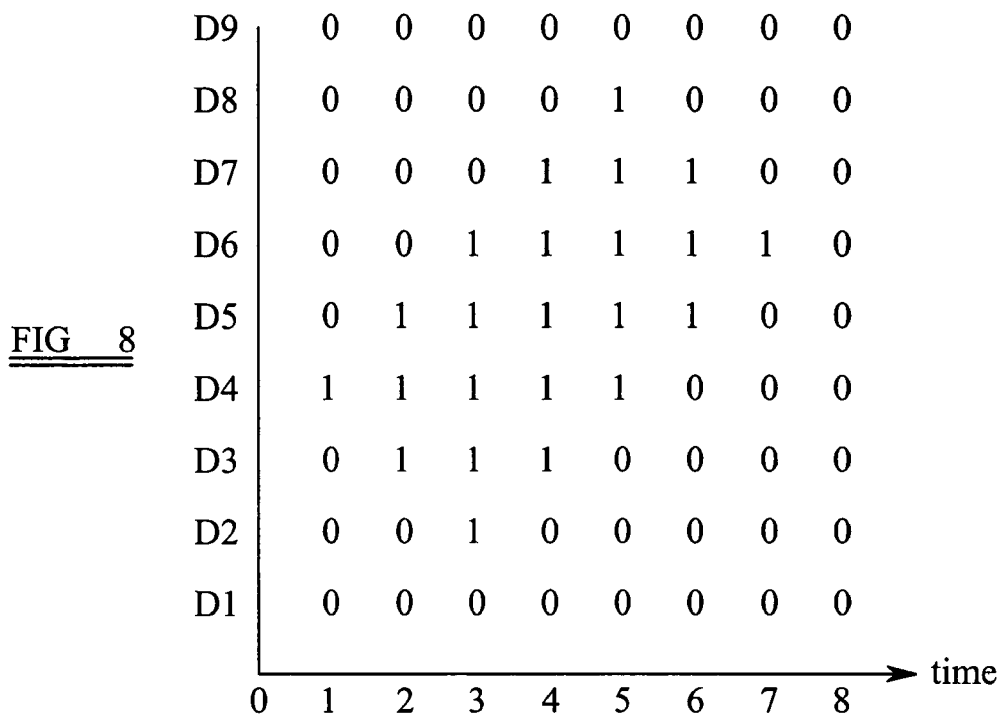

FIGS. 7 and 8 schematically illustrate the detection of a rectangular feature on a substrate surface using a transverse linear array of lenses.

Figure 9:
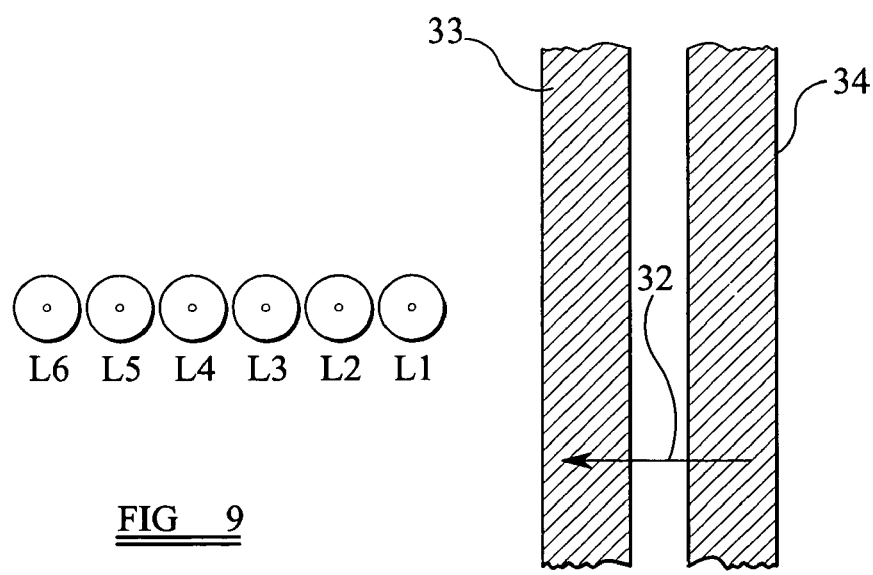

FIGS. 9 and 10 schematically represent the detection of features on a substrate surface using a longitudinally extending array of lenses.

Figure 13:
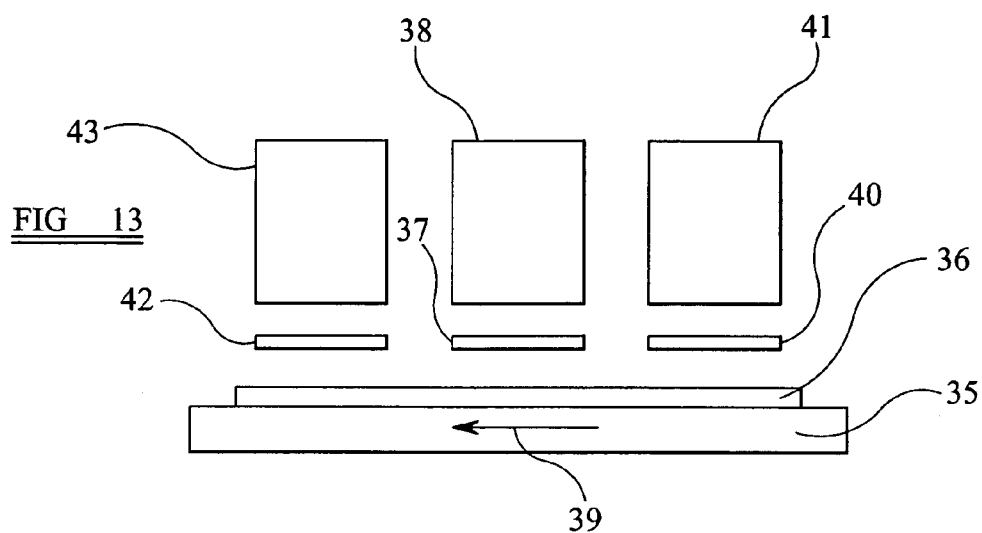

FIGS. 11, 12 and 13 schematically represent three alternative embodiments of the present invention.

Figure 14:
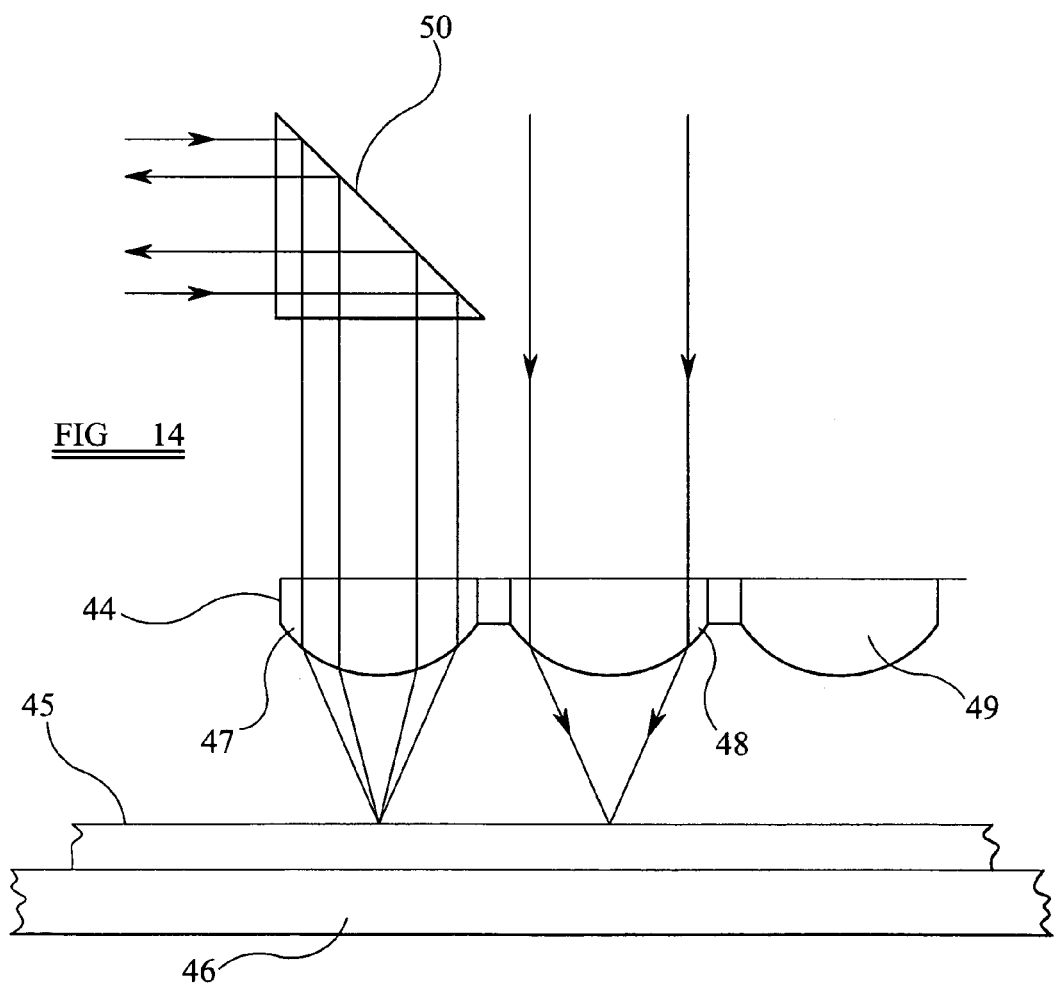

FIG. 14 illustrates one arrangement for delivering an alignment beam to a substrate through a peripheral portion of a microlens array.

Figure 15:
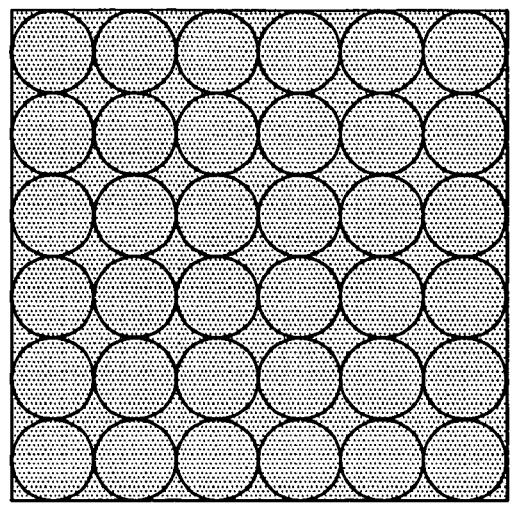
Figure 16:
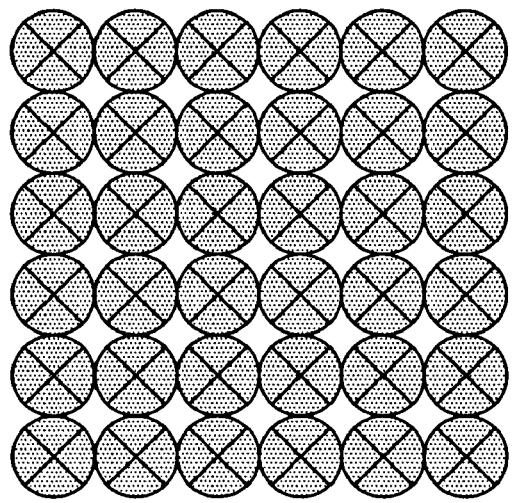
Figure 17:
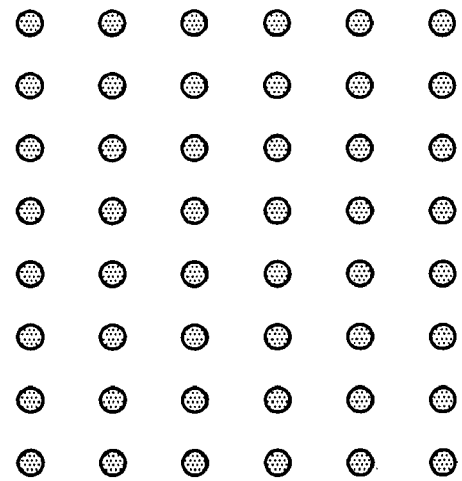

FIGS. 15, 16 and 17 illustrate a microlens array, a detector array for use with the microlens array of FIG. 15, and a pattern to be detected using the microlens array of FIG. 15 and the detector array of FIG. 16.

Figure 18:
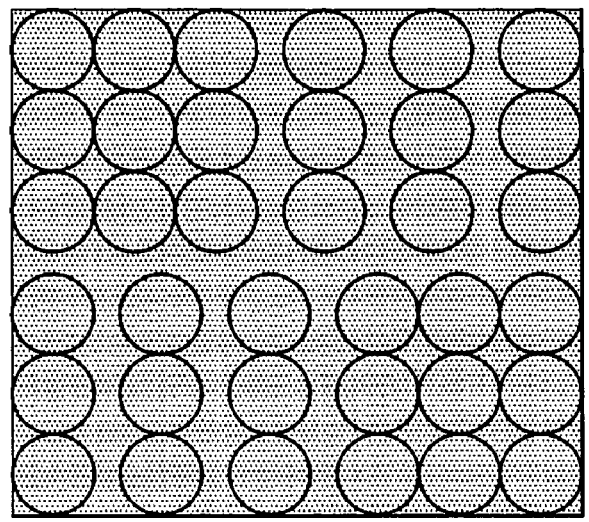
Figure 19:
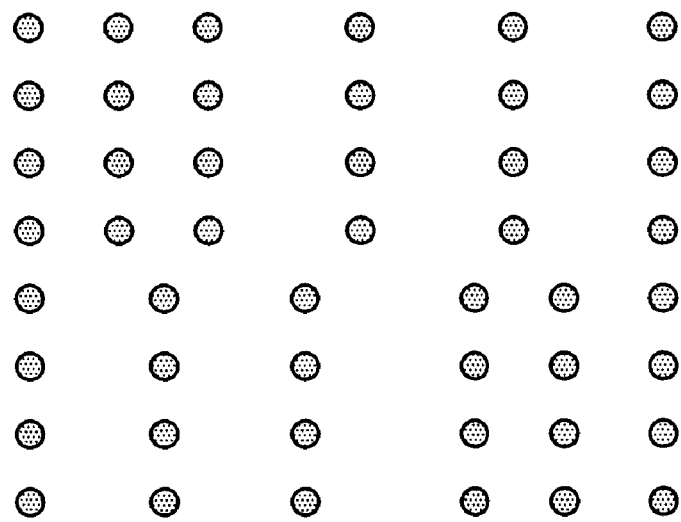

FIGS. 18 and 19 show respectively a microlens array having two different pitches and a pattern to be detected by the microlens array of FIG. 18, according to one embodiment of the present invention.

Figure 20:
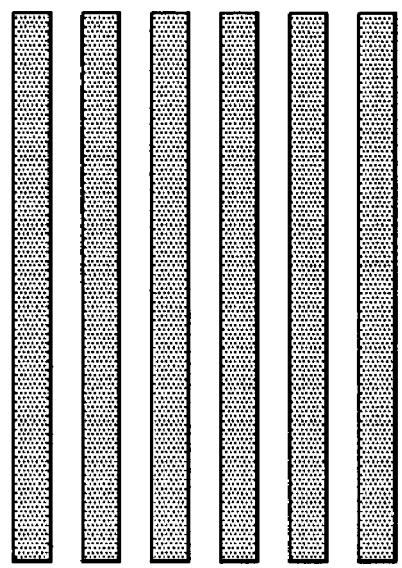
Figure 21:
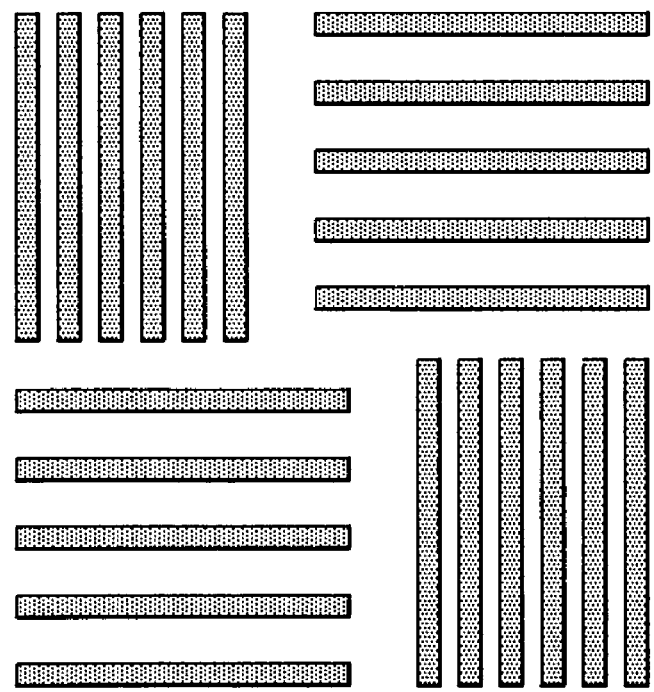

FIGS. 20 and 21 illustrate alternative phase shift grating arrangements for detection by different microlens arrays.

Figure 22:
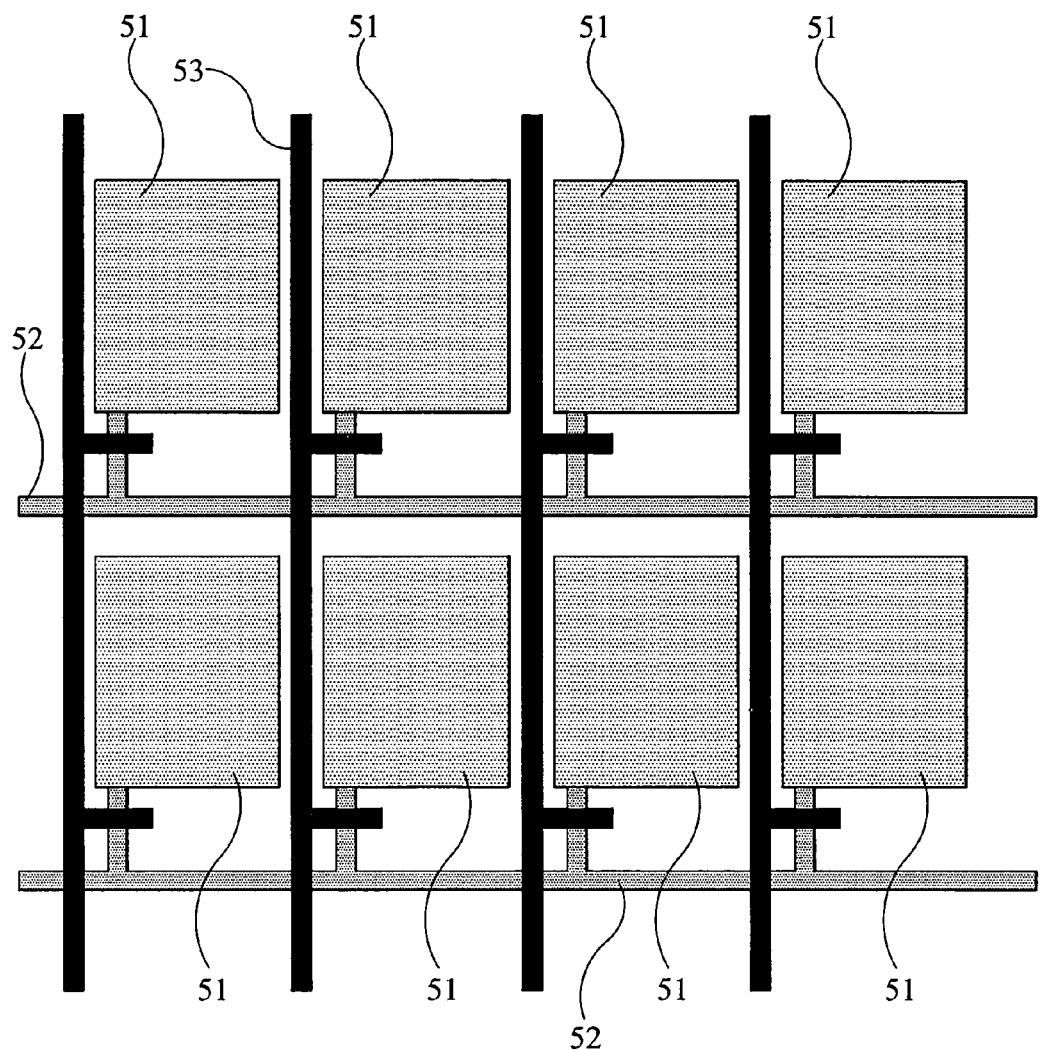

FIG. 22 illustrates a structure which is formed in a flat panel display.

Figure 23:
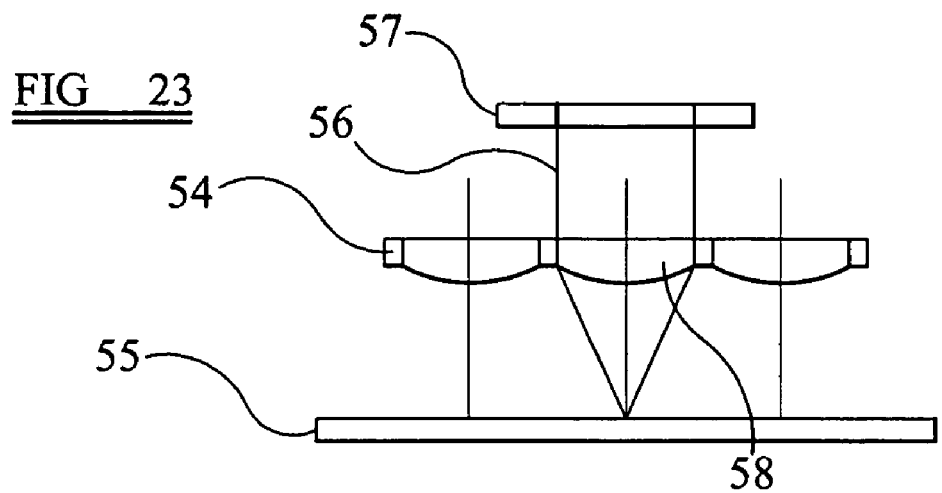
Figure 24:
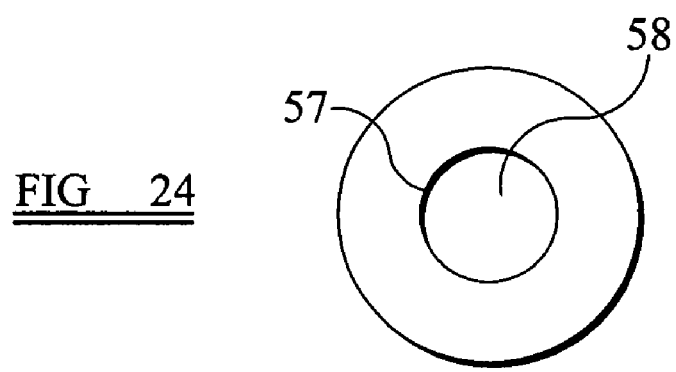
Figure 25:
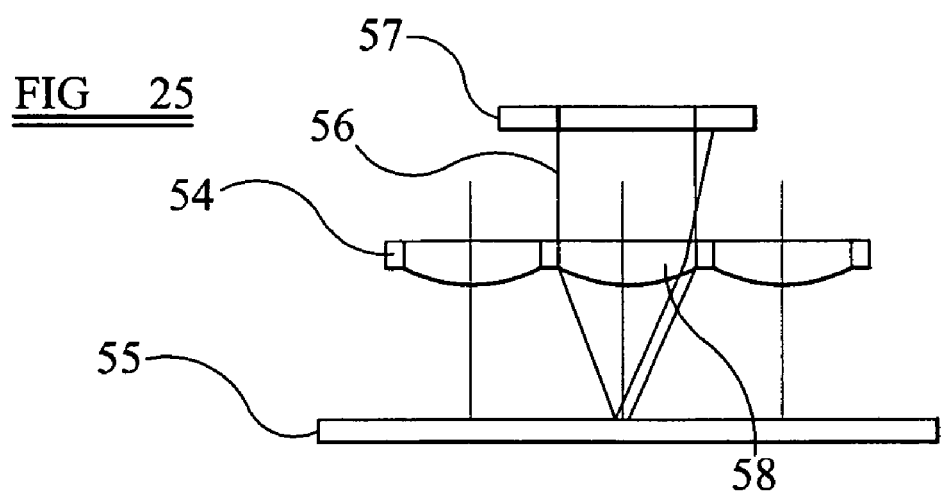

FIGS. 23 to 25 illustrate monitoring of a spacing between a substrate and a microlens array monitored.

Figure 26:
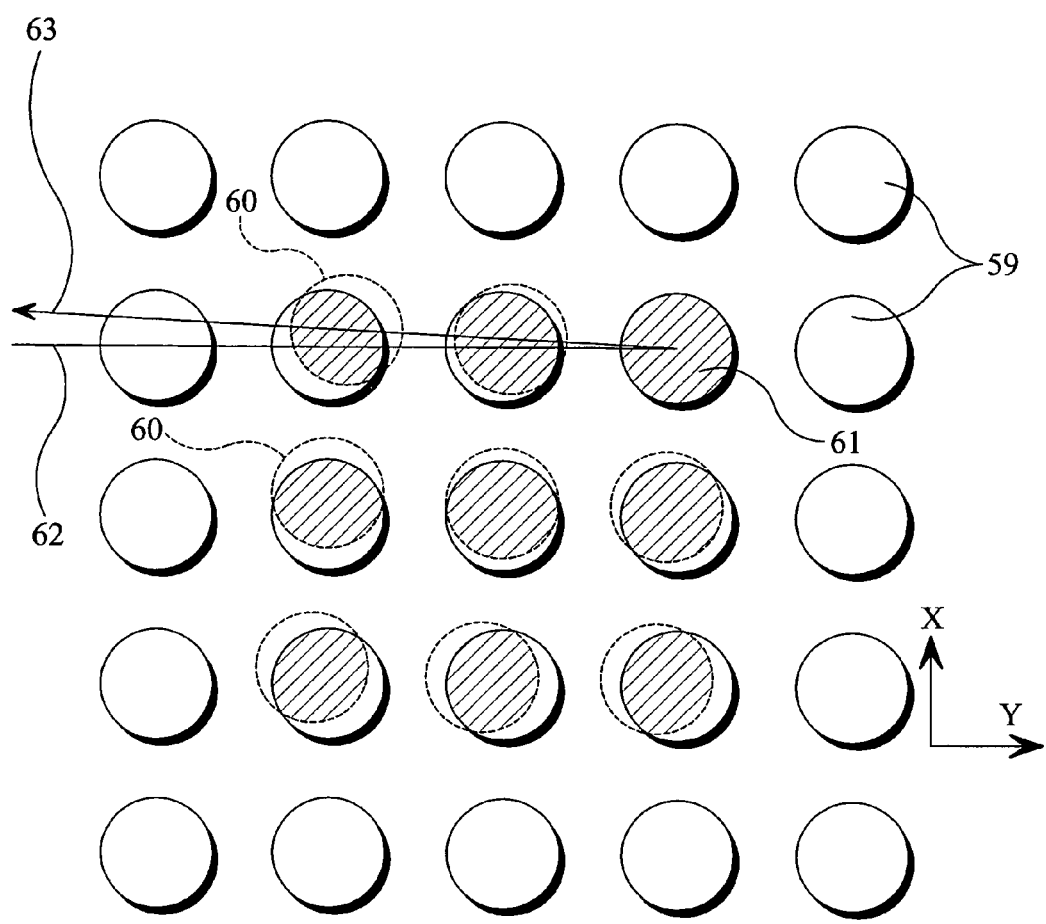

FIG. 26 illustrates a microlens array and a 3×3 pattern to be detected with that microlens array.

Figure 27:
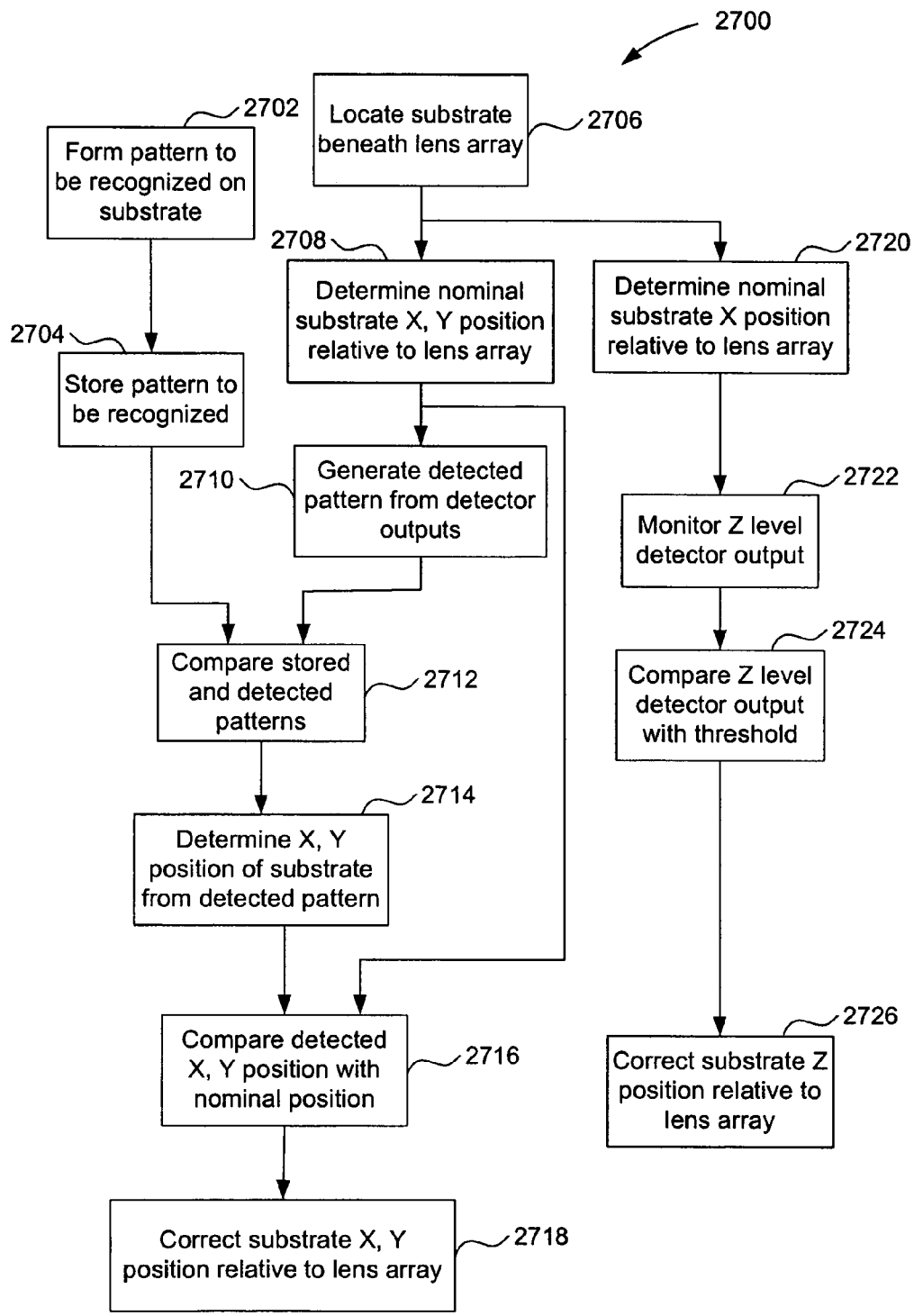

FIG. 27 is a flow diagram illustrating a method for recognizing the pattern shown in FIG. 26.

The present invention will now be described with reference to the accompanying drawings. In the drawings, like reference numbers may indicate identical or functionally similar elements.

DETAILED DESCRIPTION OF THE INVENTION

Overview and Terminology

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction from unaddressed mirrors; in this manner, the reflected beam is patterned according to the addressing pattern of the matrix-addressable mirrors. The required matrix addressing can be performed using suitable electronic means.

In both situations described above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is shown in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including, but not necessarily limited to, ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Exemplary Lithographic Projection Systems

Figure 1:
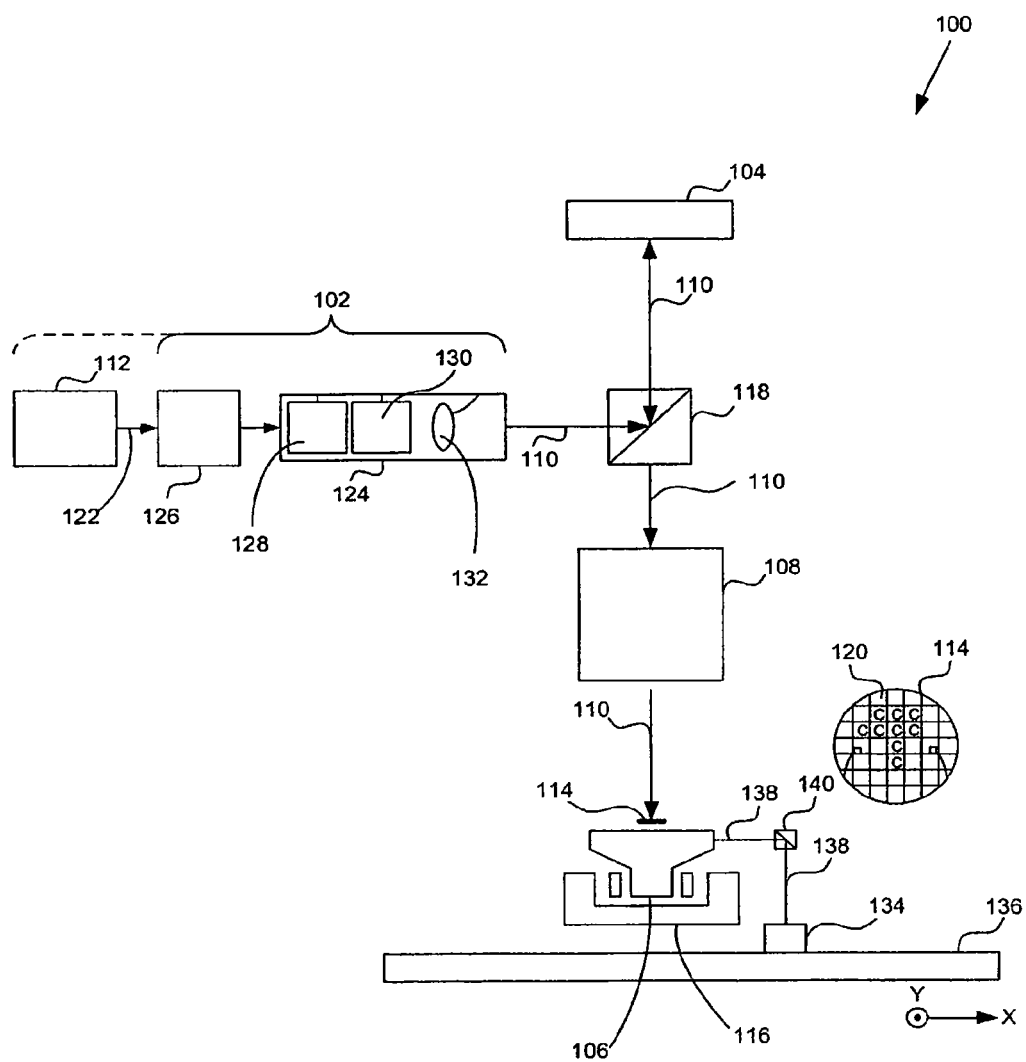
FIG. 1 depicts a conventional lithographic apparatus in which the present invention can be employed.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a projection beam 110 of radiation (e.g., UV radiation), which in this particular case also comprises a radiation source 112.

An array of individually controllable elements 104 (e.g., a programmable mirror array) can be used for applying a pattern to projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that at least both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that projection beam 110 may alternatively/additionally be moveable, while object table 106 and/or the array of individually controllable elements 104 may have a fixed position to provide the required relative movement.

In an alternative configuration, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern on the array of individually controllable elements 104 is projected in one pass (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned projection beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned projection beam 110 scans across substrate 114 and exposes it.

Combinations and/or variations on the above described modes of use or entirely different modes of use may also be employed.

Figure 2:
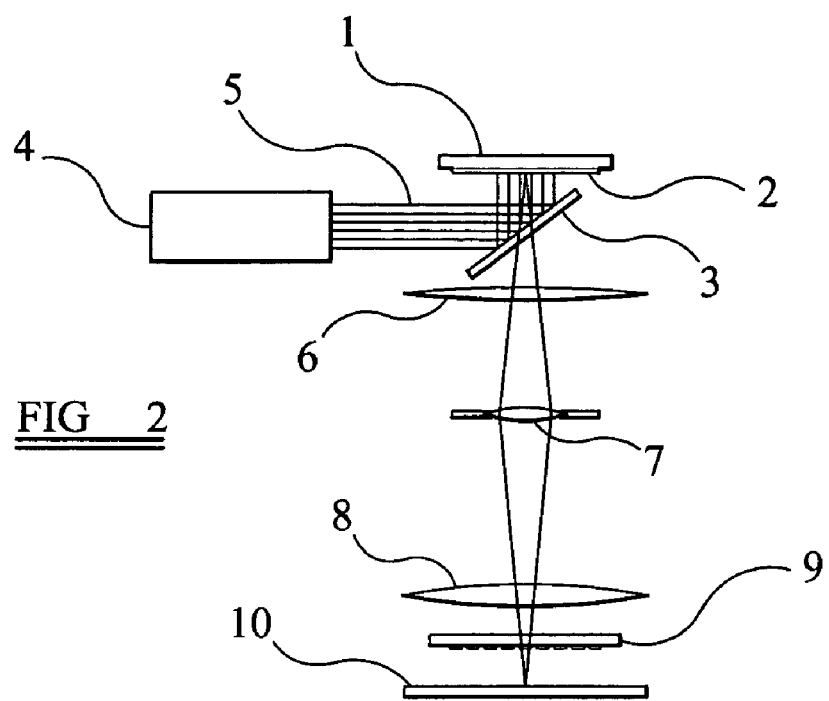
FIG. 2 is a simplified illustration of an optical projection system of the general type shown in FIG. 1 incorporating a microlens array.

FIG. 2 shows a schematic lithographic apparatus, according to one embodiment of the present invention. The apparatus comprises a contrast device 1, an underside surface of which supports a two dimensional array of elements 2, each of which can be selectively controlled to act either as an absorber or reflector of radiation. A beam splitter 3 is positioned beneath contrast device 1. An illumination source 4 directs a beam of radiation 5 towards beam splitter 3. Beam of radiation 5 is reflected onto the lower surface of contrast device 1.

One of elements 2 of contrast device 1 is shown as reflecting a component part of beam 5 back through beam splitter 3 and through projection optics, which is defined by lenses 6, 7, and 8. Lens 8 is a field lens that produces a substantially telecentric beam, which is directed towards a microlens array 9.

Microlens array 9 comprises a two dimensional array of small lenses, each of which is arranged to focus light incident upon it onto an upper surface of a substrate 10. Thus, for each of the contrast elements 2 in contrast device 1 which acts as a mirror, a respective one of the lenses in array 9 is illuminated, and a respective spot of light is projected by that lens in array 9 onto the upper surface of substrate 10.

Figure 3:
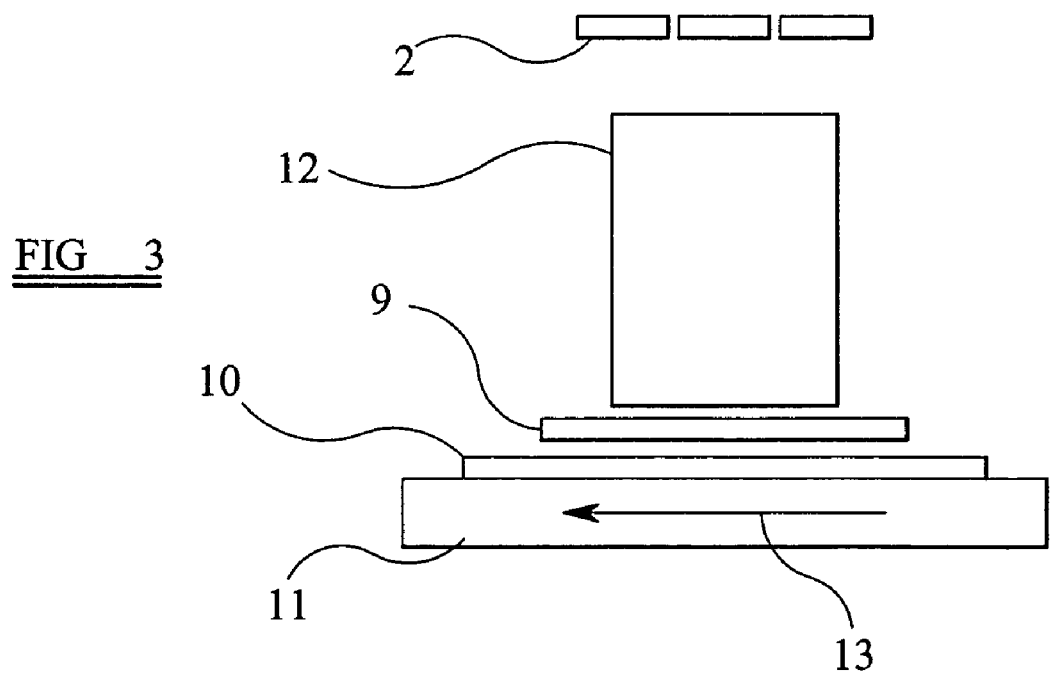
FIG. 3 is a simplified illustration of components of the system shown in FIG. 2 and including a displaceable substrate table.

FIG. 3 shows a schematic lithographic apparatus, according to one embodiment of the present invention. In FIG. 3, the substrate 10 is shown supported on a substrate table 11 beneath microlens array 9. The projection optics are represented by a simple rectangle 12. Three contrast elements 2 of contrast device 1 of FIG. 2 are shown above projection optics 12. In the illustrated arrangement, substrate table 11 is moved in a linear manner in the direction of arrow 13 beneath microlens array 9.

Figure 4:
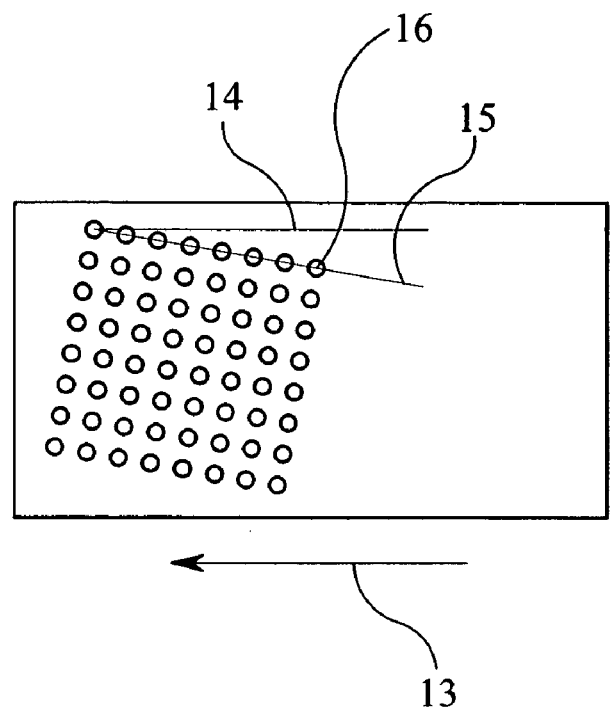
FIG. 4 is a schematic representation of the orientation of spots of light projected onto a substrate in the system illustrated in FIG. 3.

FIG. 4 shows a relationship between the disposition of the individual lenses in the microlens array 9 of FIGS. 2 and 3 and the direction of displacement of the substrate table 11 of FIG. 3, according to one embodiment of the present invention. Again, the direction of displacement is represented in FIG. 4 by arrow 13. That direction is parallel to a line 14 that is inclined to a further line 15, which extends parallel to a row of the lenses in microlens array 9.

Each lens projects light onto a different one of a rectangular array of spots, one of which is identified by numeral 16. The lenses are arranged in a regular two dimensional array that is slightly inclined to direction of displacement 13 of substrate table movement. The entire surface of substrate 10 can be exposed by appropriate control of the illumination beams delivered to the respective lenses by respective elements 2 of contrast device 1. Each lens can, in effect, "write" a continuous line on the surface of substrate 10. Given the disposition of the lenses relative to the direction of substrate movement, those lines are sufficiently close together to overlap. In order to expose a selected two dimensional area of substrate 10, substrate 10 is advanced beneath microlens array 9. The individual lenses beneath the area to be exposed are illuminated by rendering the associated elements 2 of contrast device 1 reflective.

It is important that the appropriate portions of the surface of substrate 10 are exposed. For example, this is particularly true when a substrate surface is exposed a relatively large number of times with a high degree of accuracy being required between the relative positions of the different exposure patterns.

This alignment problem has been addressed by forming alignment marks on a substrate to define reference positions relative to which it is possible to determine the location of areas of the substrate surface to be exposed. The smaller the spacing between alignment marks, the greater the accuracy with which the relative position of points on the substrate can be determined. Unfortunately, in some circumstances, such as the manufacture of large LCD arrays, it is not possible to provide alignment marks that are sufficiently close together to maintain a high degree of positional accuracy.

Thus, one or more embodiments of the present invention use an array of lenses, such as that incorporated in a microlens array, to determine the position of features on the surface of a substrate with a high degree of precision.

Exemplary Lithography Systems and Methods Utilizing Microlens Arrays

Figure 5:
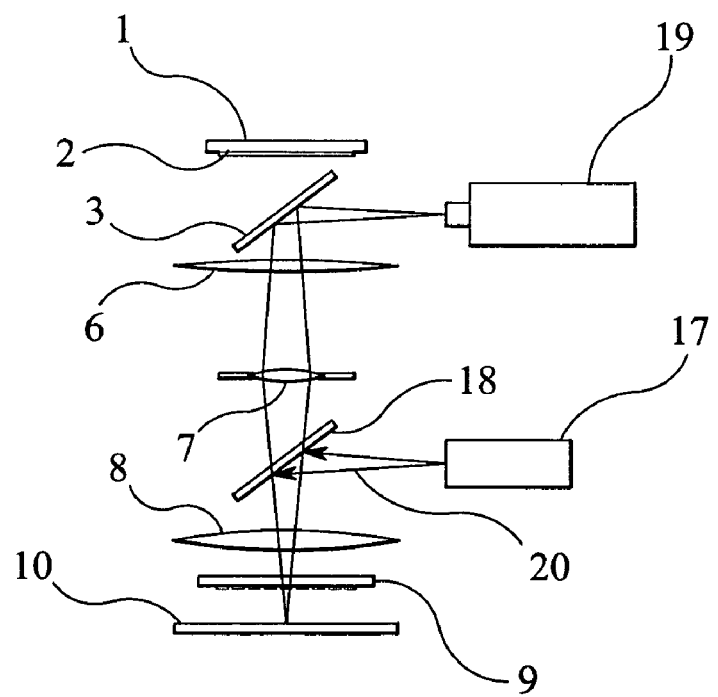
FIG. 5 is a schematic representation of one embodiment of the present invention.

FIG. 5 illustrates a lithography system, according to one embodiment of the present invention. The same reference numerals are used in FIG. 5 as were used in FIG. 2, where appropriate. A main difference between FIGS. 2 and 5 is that the system in FIG. 5 incorporates three additional components. Those three components are an alignment illumination source 17, a second beam splitter 18, and a two dimensional array of detectors (not specifically shown). In one example, the two dimensional array of detectors is a two dimensional CCD array incorporated in an input device to a processor 19.

In a first example, the system in this embodiment operates similarly to the system in FIG. 2 when exposure illumination source 4 is active and alignment illumination source 17 inactive. If operated in such a manner, beam splitter 18 would have substantially no effect.

In another example, exposure source 4 can be rendered inactive and source 17 rendered active, so as to generate a beam 20 of radiation that is reflected by beam splitter 18 through field lens 8 of the projection optics and microlens array 9 onto substrate 10. Light from illuminator 17 will illuminate substantially all of microlens array 9, and thus a full two dimensional set of illumination spots, such as represented in FIG. 4, will be directed onto the upper surface of substrate 10. Light will be reflected from each of those spots, the intensity of the reflected light being a function of the local reflectivity of the surface of substrate 10. Reflected light will pass through microlens array 9 and the projection optics to beam splitter 3, and will be reflected by beam splitter 3 onto the two dimensional array of detectors providing inputs to the processor 19. In this example, there is a one to one relationship as between the detectors in the detector array and the lenses in microlens array 9.

Figure 6:
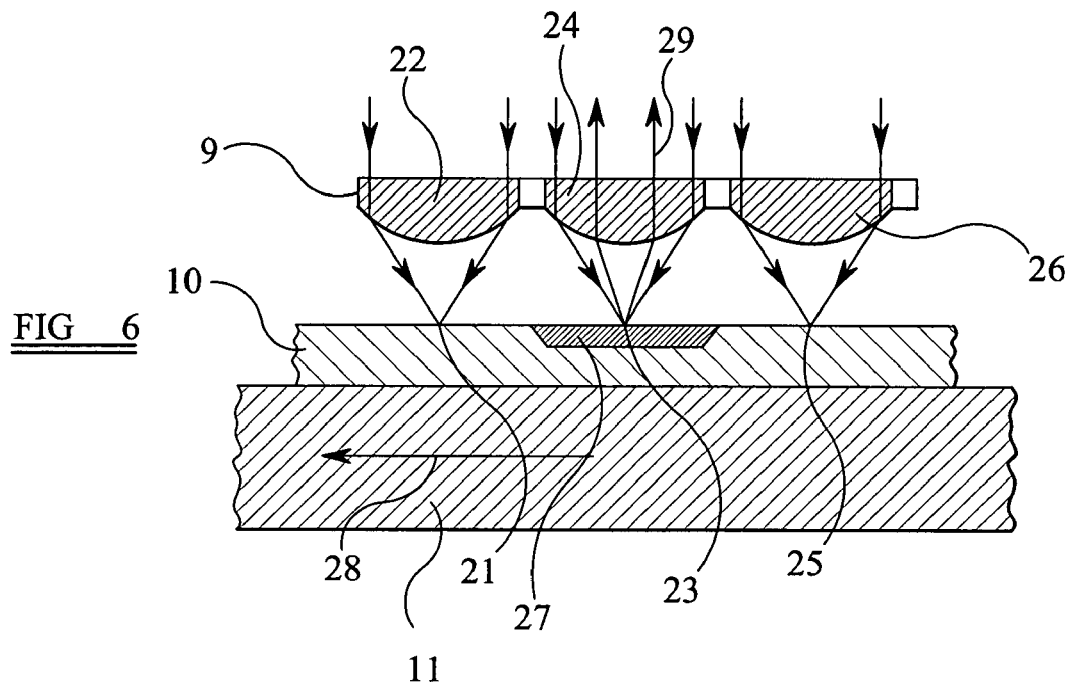
FIG. 6 is a schematic representation of an area of a substrate onto which light is projected by part of a microlens array incorporated in the apparatus of FIG. 5.

FIG. 6 schematically represents the reflection of light from substrate 10 mounted on substrate table 11. FIG. 6 shows one lens from each of three rows of lenses adjacent one edge of microlens array 9. Light from illumination source 17 is focused onto a spot 21 by lens 22, onto a spot 23 by lens 24, and onto a spot 25 by lens 26. A surface feature 27 that could have been formed, for example, as the result of a prior exposure of substrate 10 is defined in the surface of substrate 10. As the substrate table is advanced in the direction of arrow 28 the feature 27 will pass successively beneath lenses 26, 24 and 22. Assuming that as shown, feature 27 is beneath lens 24 and that the reflectivity of feature 27 is relatively high, light will be reflected back from the substrate surface as indicated by rays 29. Assuming that the remaining surface of substrate 10 is highly absorbent to the incoming radiation, substantially no radiation will be reflected back through lenses 22 and 26. The detector associated with lens 24 will receive a relatively high intensity beam of radiation, whereas the detectors associated with lenses 22 and 26 will receive substantially no radiation. By monitoring the outputs of those three detectors, it is possible to know that there is a relatively highly reflective feature on the surface of substrate 10 that extends at least across the region illuminated by lens 24 and which does not extend to the regions illuminated by lenses 22 and 26. Thus, accurate information can be derived about the position relative to the lens array of surface features on the substrate.

In this embodiment, it is assumed that feature 27 is more reflective than the remaining surface. In general, substrate 10 will be more reflective than resist patterns formed on substrate 10. Regardless of whether a particular area is more or less reflective than an adjacent area, however, it is possible in accordance with the invention to distinguish between such areas.

FIGS. 7 and 8 show the use of an array of nine lenses extending transversely to the direction of substrate transport to detect the boundaries of a rectangular feature on the substrate surface.

FIG. 7 represents by rectangle an outline of a feature 30 to be detected. Feature 30 is formed on the surface of a substrate that is moved in the direction of arrow 31 beneath an array 2 of nine lenses L1 to L9. Lenses L1 to L9 are fixed in position. FIG. 7 shows the relative position of lens array 2 to feature 30 at time t=0 (see FIG. 8 for time plot). At time t=1, lens array 2 will be aligned with the vertical axis indicated by numeral 1, at time t=2 lens array 2 will be aligned with the vertical axis 2, at time t=3 lens array 2 will be aligned with the vertical axis 3, and so on.

FIG. 8 is a representation of outputs of nine detectors D1 to D9 that monitor light reflected from lenses L1 to L9, respectively. A numeral 0 indicates a detected intensity below a threshold and a numeral 1 indicates a detected intensity above that threshold. Thus, at time t=1 detector D4 will be detecting a relatively high intensity beam of radiation to indicate that lens L4 is over one corner of feature 30. By way of further example, at t=6 detectors D5, D6 and D7 will be indicating relatively high intensity beams because at that time lenses L5, L6 and L7 will be over feature 30. It will be seen that the distribution of numerals 1 in FIG. 8 corresponds in outline to the outline of feature 30, and thus positional information about feature 30 can be derived from the data represented in FIG. 8.

FIGS. 9 and 10 illustrates a configuration of an array of lenses and an output, respectively, according to another embodiment of the present invention. The output in FIG. 10 is derived from an array of lenses aligned with the direction of advance of a substrate beneath those lenses. For example, six lenses L1 to L6 are positioned above a substrate that is moved in the direction of arrow 32 and that has formed on it features 33 and 34. At time t=0 the position of the lens array relative to the features is as shown in FIG. 9. At time t=1, lens L1 will be vertically aligned with numeral 1 on the time axis, at time t=2 lens L1 will be aligned with 2 on the time axis, and so on.

As discussed above, FIG. 10 schematically represents the output of detectors D1 to D6 based on light reflected through respective lenses L1 to L6. For example, at time t=3 detectors D1 and D2 receive a relatively high intensity beam and at time t=6 detectors D1, D2, D4 and D5 receive a relatively high intensity reflected beam. Assuming that the substrate moves an equal distance during each interval between the successive time periods, the outputs of detectors D1 to D6 will be identical except for an appropriate phase shift dependent upon the spacing between the respective lenses L1 to L6. However, if detectors D1 to D6 are sampled at regular intervals, but as a result of some process disruption the substrate is not moved at a continuous speed, the outputs from the different detectors D1 to D6 would differ not only in phase. Thus, a linear array of lenses L1 to L6 aligned with the direction of substrate transport can be used to detect non-uniformity in substrate transport, as well as substrate feature position.

FIG. 11 schematically represents another configuration of a lithography system. A substrate table 35 supports a substrate 36 which is advanced beneath a microlens array 37 illuminated by projection system 38. When it is desired to expose, for example, a layer of resist formed on the surface of substrate 36, the appropriate illumination pattern is delivered through projection system 38 as substrate table 35 is advanced in the direction of arrow 39. If, on the other hand, it is desired to detect features on the substrate surface, for example, features resulting from an earlier exposure of the resist, the resist can be exposed by alignment light projected through projection system 38.

In alternative examples, the light must be of sufficiently low intensity as to not significantly develop the resist, or only portions of the substrate surface that are used only for alignment assessment purposes are exposed so that over-exposure is not a problem or the alignment beam should have a wavelength such that the resist does not respond to exposure.

For example, the resist could be exposed using blue light and the position of its surface features could be monitored using red light. In such circumstances, it would of course be necessary to compensate for chromatic effects in projection system 38.

In the configuration illustrated in FIG. 11, surface features will be detected in a first "alignment" scan to generate feature position information which would be used in a subsequent "exposure" scan.

FIG. 12 schematically represents a further configuration of a lithography system. In this embodiment, during a single scan feature position information is generated and substrate 36 is exposed to light on the basis of that information. The substrate surface is exposed using projection system 38 and a microlens array 37. Upstream of elements 37 and 38, an alignment optical system made up of microlens array 40 and projection system 41 is provided. Light reflected back from the surface of substrate 36 through microlens array 40 is detected so as to generate the necessary positional information with regard to the positions of features of different reflectivity on the substrate surface.

FIG. 13 schematically represents a still further configuration of a lithography system. In this embodiment, elements 37 and 38 are disposed downstream of alignment optics 40, 41 and upstream of fault detection optics comprising a microlens array 42 and a projection system 43. Light reflected from the surface of substrate 36 through microlens array 42 is detected and used to generate positional information indicative of features formed on substrate 36. Thus, if there is a failure in elements 37 and 38, such that the appropriate features are not formed on the surface of substrate 36, this can be immediately detected by monitoring the output of the fault detection optics 42, 43. In an example, this can be done using latent images, which are images that have been formed by exposure, but which have not yet been developed.

Thus, whereas FIG. 11 shows an arrangement in which common optical components are used for both feature monitoring and exposure, in FIG. 12 and 13 different components are used. In FIGS. 12 and 13 these components are shown as completely separate assemblies. However, such systems can make use of a combination of different and common components, for example as illustrated in FIG. 14.

FIG. 14 schematically represents a still further configuration of a portion of a lithography system. In this embodiment, a microlens array 44 is shown positioned above a substrate 45 supported on a substrate table 46. Three lenses 47, 48 and 49 of microlens array 44 are shown. It will be appreciated that lens 47 will be one of a row of lenses extending along one side of a microlens array, lenses 48 and 49 forming parts of two further rows. The row of lenses incorporating lens 47 is used for feature monitoring purposes. Light being projected through lens 47 by a prism 50 and light reflected from the surface of substrate 45 is reflected back to detectors (not shown) by the same prism 50. In contrast, lens 48 serves to focus a beam of exposing light onto the surface of substrate 45. Thus, it will be appreciated that a peripheral portion of a microlens array may be used to derive positional information directly related to the position of the same lens array which determines the position of spots of exposure radiation projected onto the surface of the substrate. Depending on the application, lens 49 operates similarly as lens 47 or 48, and in one example is used as an alignment lens.

Surface feature information derived from an arrangement such as that shown in FIG. 14 cannot generally be used for "on the fly" control of exposure of the same substrate during the same scanning procedure. This is because there will be insufficient time for the system to respond to any misalignments detected by the feature position monitoring system (unless the microlens array is so large that there is sufficient distance between lens 47 and lenses 48/49 to provide sufficient response time). In contrast, better "on the fly" control can be achieved with an arrangement such as described with reference to the embodiments of FIG. 12 or FIG. 13.

It will be appreciated that different rows of a microlens array may be used on both the upstream and downstream sides of a microlens array to detect features of a substrate as they pass beneath the array and to detect features of the substrate as they emerge from beneath the array. Thus a configuration such as that schematically represented in FIG. 13 could be achieved with a single microlens array.

Exemplary Microlens Arrays and Detection Configuration

FIGS. 15, 16 and 17 show a microlens array, a detector array designed to detect light reflected through such a lens array, and a spot pattern suitable for use as an alignment mark on a substrate with such arrays. FIG. 15 shows a 6×6 microlens array with each of the circles of FIG. 15 corresponding to a single microlens. In one example, each microlens will have a diameter of about 50 to about 500 micrometers. In another example, each microlens will have a diameter of about 80 micrometers. The array may have any appropriate numbers of lenses within it, for example a 512×512 array of lenses, and the lens size may be selected as appropriate to the application.

FIG. 16 shows a 6×6 array of detectors matched to detect beams of light from the lens array of FIG. 15. Each circle in FIG. 16 represents a single detector. The diameter of each detector may be the same as the diameter of the respective lens in the lens array from which light is received, or could be any size appropriate to the magnification of the projection system interposed between the lens array and the detector array. Similarly, each detector may be arranged as a series of sub-detectors, this being represented in FIG. 16 by the division of each detector into four quarter-circle segments. Each of the sub-detectors could be used to generate a separate detection signal, the relative intensities of those signals providing a measure of the degree to which the illuminating radiation is centered on the centre of the four sub-detectors. The ability to measure the intensity distribution of the image of a spot on the substrate being monitored would make the system more sensitive to small misalignments.

FIG. 17 represents a pattern which could be formed on the surface of a substrate to be monitored. The pattern of FIG. 17 is a 6×6 array matched to the configuration of the microlens array of FIG. 15 and the detector array of FIG. 16. It will be appreciated that the pitch of the spot array pattern of FIG. 17 will be the same as the pitch of the lens array so that light reflected from each of the spots will simultaneously pass through each of the lenses of the array when the spots and lenses are fully aligned.

It is desirable to use the same MLA that is used for position detection to expose the alignment target. By doing so, the positioning errors of the individual lenses of the microlens array can be reduced to a minimum (the "fingerprint" of the MLA is eliminated)

FIG. 18 shows an alternative microlens array with two different pitches for use in a phase grating alignment application. In this embodiment, the top left hand corner and the bottom right hand corner of FIG. 18 show 3 ×3 arrays of lenses with, for example, a diameter of about 80 micrometers. The top right and bottom left corners show a 3×3 array with the same 80 micrometer dimensions, but with a pitch between adjacent columns of about 88 microns. A similar detector distribution would be necessary to detect light reflected through such a lens array.

FIG. 19 shows a spot array pattern suitable for use with the microlens array of FIG. 18, according to this embodiment. The pitches of the spot array pattern are matched to the pitches of the rows of lenses in the microlens array of FIG. 18 and to the pattern of the detectors.

Exemplary Alignment Marks

FIG. 20 shows a phase shift grating pattern which can be used as an alignment mark on a substrate. In one example, a pitch of the grating is the same as the pitch of the lenses in the microlens array of FIG. 15.

FIG. 21 shows an alternate phase shift grating alignment pattern. This embodiment would be suitable for use with a microlens array having a top left hand and bottom right hand array of six rows of closely spaced lenses and a bottom left hand and top right hand array of five rows of relatively widely spaced lenses. For example, the pitch of the gratings in FIG. 21 could be about 80 μm for the top left set of six lines, about 88 μm for the top right set of five lines, about 88 μm for the bottom left set of five lines, and about 80 μm for the bottom right set of six lines. The mutually perpendicular sets of lines of FIG. 21 can be used in accordance with known phase grating alignment principles to generate a very accurate positional response.

FIGS. 17, 19, 20 and 21 show examples of patterns which can be readily detected using an apparatus in accordance with the present invention. Such patterns could be formed on the surface of the substrate to provide alignment marks and not to provide functionally significant structures in for example an electronic device. The present invention can be used however to detect features that are formed not merely for alignment purposes but primarily for functional purposes.

Exemplary Flat Panel Display Measuring

FIG. 22 schematically represents the layout of exposure patterns formed in a Thin Film Transistor (TFT) liquid crystal flat panel display device. Rectangular areas 51 represent liquid crystal elements typically of the order of about 100 micrometers wide and high. Adjacent rows of elements 51 are separated by address lines 52 and adjacent columns of the elements 51 are separated by data lines 53.

There is very highly developed regularity to the structure, and that structure may be of the order of 1 meter across. Features making up that structure, for example the lines 52 and 53, can relatively easily be formed so as to have a substantially different reflective characteristic as compared with the immediately adjacent regions of the structure. If such a structure is advanced beneath a microlens array to focus an alignment projection beam onto the surface operating in accordance with one or more embodiment of the present invention discussed above, the positions of the control lines relative to the microlens array can be relatively easily detected. Rather than relying on preformed alignment marks, a successive series of processing steps can use the features formed in preceding processing steps for alignment purposes. For example, if a first feature was deposited on the basis of preformed alignment marks, but that first feature was slightly misaligned, a second feature could then be deposited in the appropriate position relative to the misaligned first feature by ensuring that the second feature is aligned with the first feature rather than with the initial alignment marks.

Exemplary Monitoring Operation and Arrangement

FIGS. 23, 24 and 25 illustrate how the present invention may be used to monitor the distance between a microlens array and a substrate which is being moved relative to that microlens array. The distance between the array and the substrate can, for example, be measured at three different positions to enable control of leveling of the array relative to the substrate.

FIG. 23 shows a microlens array 54 correctly positioned above a substrate 55 such that a parallel beam of light 56 is focused onto a spot on the substrate surface. Beam 56 is projected through an aperture defined by an annular detector 57, illustrated in FIG. 24, the open center of detector 57 being centrally located over a central lens 58 of the microlens array. Assuming that the spacing between the lens 58 and the surface of the substrate 55 is correct, substantially all of any light reflected from the substrate 55 will pass through the open centre of the detector 57. Thus, an output representative of the intensity of light reaching the annular detector 57 will be very low.

FIG. 25 illustrates what will happen if the spacing between the microlens array 54 and the substrate 55 is too small. The size of the spot formed on the surface of the substrate 55 will be substantially increased. As a result light reflected from the surface will diverge above the microlens array 54. Some of that light will strike the underside of the detector 57. That light is detected and will provide an output. Thus, the detected intensity of the light striking the underside of the detector 57 can be used in a control mechanism which lifts the microlens array 54 away from the substrate 55 until the detected intensity falls for example below a predetermined threshold.

FIGS. 26 and 27 show detected reflection spots and a flow chart, respectively.

In FIG. 26, a 5×5 array of circles 59 represents the positions of spots of illumination produced on a substrate by a 5×5 microlens array when each of the twenty five lenses in that array is illuminated with an alignment beam. An alignment mark in the form of a 3×3 array of circles indicated by broken lines 60 overlaps the central 3×3 portion of the 5×5 array of circles 59. Circle 61 indicates precise registration between one circle 59 and one circle 60. Regions of overlap between circles 59 and 60 are shown shaded. Circles 59 are arranged in five rows parallel to a line 62 and in five columns perpendicular to line 62. In contrast, circles 60 are arranged in three rows parallel to line 63 and three columns perpendicular to line 63. Lines 62 and 63 are inclined to each other by a small angle such that during movement of a substrate carrying the 3×3 array of alignment spots those spots will move relative to the microlens array in the direction of line 63.

FIG. 26 shows the circumstances at the instant when the spot at the top right hand corner of the alignment mark is perfectly aligned with the illumination spot in the second row of illumination spots counting downwards and the second row counting from the right. At that instant, the position of the substrate carrying the alignment spots relative to the microlens array projecting the alignment beams can be precisely determined in the plane indicated by axes X, Y.

In this embodiment, the nature of the alignment mark will be known in advance, and therefore the system can be set up to search for a pattern which causes a 3×3 array of the detectors associated with the lenses of the microlens array to detect reflected portions of the alignment beam. The output of each detector will peak as the area of overlap between the projected spots and the spots of the alignment mark overlap to the greatest extend and the height of that peak will be a function of the area of overlap. Thus, the highest peak in the case illustrated in FIG. 26 will relate to spot 61 at the top right hand corner of the 3×3 array in the centre of FIG. 26.

The output from the detector at the bottom right hand corner of the 3×3 array will have just passed its peak, whereas the output from the detector associated with the top left hand corner of the 3×3 array would be approaching its peak. Assuming that the processor of the system is set up to look for a 3×3 array, it will be readily apparent from looking at the outputs of the 5×5 array of detectors associated with the 5×5 array illustrated in FIG. 26 where the 3×3 alignment mark is relative to the microlens array. By then, referring to the relative intensities of the light reflected from that 3×3 array, the position of the lens most accurately aligned with one of the 3×3 array of alignment spots could be readily identified and thus the X, Y coordinates of the alignment mark relative to the lens array could be accurately determined.

A separate detector set up in the manner illustrated in FIGS. 23 to 25 could detect the spacing between the microlens array and the substrate, that is the Z coordinate of the substrate relative to the microlens array. The position of a substrate relative to the microlens array would then be fully determined.

Referring now to FIG. 27, method 2700 is a representation of the operation of a processor.

In step 2702, a pattern to be recognized is formed on a substrate. For example, in the case illustrated in FIG. 26, this is a 3×3 array of reflective spots with the pitch of the array being equal to the pitch of lenses in the microlens array. The invention is not limited to a 3×3 array. It will be apparent to ones skilled in the relevant arts that other array configurations can be used. In step 2704, the pattern is stored for future reference.

In step 2706, the substrate carrying the predetermined pattern is located beneath a lens array and displaced relative to the lens array.

In step 2708, a metrology system of the lithographic apparatus determines the nominal X, Y position of the substrate relative to the lens array given the nominal position of the substrate on the substrate table and the nominal displacement of the substrate relative to the microlens array.

In step 2710, outputs of the detectors generate a detected pattern, which is compared with the stored pattern at step 2712. In step 2714, that comparison allows for the determination of the X, Y position of the substrate from the detected pattern. In step 2716, the determined X, Y position is compared with the nominal X, Y position. In step 2718, an appropriate correction is made to the position of the substrate to take into account any difference revealed by that comparison.

In this example, alignment is measured at least at two locations of the substrate. Thus offsets in X Y, rotation, and magnification of the substrate can be determined.

In step 2720, a nominal substrate Z position relative to the lens array is determined. In step 2722, an actual Z level is determined, for example using a Z level detector, such as that described in FIGS. 23 to 25. In step 2724, the output of the Z level detector is compared with a threshold. In step 2726, the position of the substrate is corrected as appropriate to ensure that the position of the substrate is in accordance with the nominal desired position in the Z direction.

Thus, method 2700 allows for full control of substrate position relative to the lens array in three dimensions.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An optical position measurement apparatus, comprising:
an illumination system that supplies a beam of radiation;
a substrate table that supports a substrate;
a projection system that projects the beam of radiation onto a target portion of the substrate;
a positioning system that causes relative movement between the substrate and the projection system; and
a measurement system that determines a position of at least a component of the projection system relative to the substrate, the measurement system comprising,
an array of lenses arranged such that each lens in the array focuses a respective portion of the beam onto a respective part of the target portion,
an array of detectors arranged such that each corresponding detector in the array detects light reflected from a previously formed portion of a feature on the substrate through a corresponding lens in the array and provides an output representative of an intensity of light reflected from the portion of the feature on the substrate to the detector through the corresponding lens, and
a processor connected to the outputs of the detectors that derives data representing the position of the lens array relative to the substrate from the outputs of the detectors, which processor sends a signal to the positioning system to relatively align the substrate during exposure of a subsequently formed portion of the feature on the substrate.

2. The apparatus according to claim 1, wherein at least one detector comprises at least two sub-detectors arranged to detect non-uniform illumination of the at least one detector.

3. The apparatus according to claim 1, further comprising:
a system that supplies an exposing beam of radiation, wherein the array of lenses is arranged to focus the exposing beam on the substrate.

4. The apparatus according to claim 1, wherein:
at least one detector is arranged such that only if a spacing between the substrate and an associated lens of the array is not correct will light reflected through the associated lens be incident upon the at least one detector; and
the processor is arranged to detect an incorrect spacing between the substrate and the array of lenses if light of a predetermined minimum intensity is incident upon the at least one detector.

5. The apparatus according to claim 1, wherein the processor is arranged to determine characteristics of regions of the substrate beneath the lens array from the detected intensities and to derive a measure of the position of the substrate from the detected intensities.

6. The apparatus according to claim 1, wherein the lens array is a component of a lithographic apparatus comprising a device that patterns an exposure beam, which is projected onto the substrate.

7. The apparatus according to claim 4, wherein:
at least two detectors are arranged such that only if a spacing between the substrate and associated lenses of the array is not correct will light reflected through the associated lenses be incident upon the at least two detectors; and
the processor is arranged to correct the spacing between the substrate and the lens array, so as to level the array of lenses relative to the substrate if light of a predetermined minimum intensity is incident upon any one of the at least two detectors.

8. The apparatus according to claim 4, wherein the at least one detector is annular so as to define an opening through which the respective portion of the beam is projected onto a respective lens of the array.

9. The apparatus according to claim 5, wherein the processor is arranged to derive an intensity pattern corresponding to the detected intensities, to compare the derived intensity pattern with a stored intensity pattern corresponding to an alignment pattern, and to determine the position of the substrate relative to the lens array from the position of lenses within the lens array from which a pattern is derived, which is the same as the stored intensity pattern.

10. The apparatus according to claim 9, wherein the processor is arranged to provide a fault-indicating output if no pattern is derived that is the same as the stored intensity pattern.

11. The apparatus according to claim 6, wherein the patterned exposure beam and the beam of radiation are generated from a common source.

12. The apparatus according to claim 6, further comprising:
an exposure illumination source for generating the patterned exposure beam; and
an alignment illumination source for generating the beam of radiation; wherein
the patterned exposure beam and the beam of radiation have different wavelengths.

13. The apparatus according to claim 12, wherein the projection system projects both the beam of radiation and the patterned exposure beam to the array of lenses.

14. The apparatus according to claim 12, wherein the projection system comprises:
first and second projection systems corresponding to the beam of radiation and the patterned exposure beam, respectively, the first and second projection systems project the beam of radiation and the patterned exposure beam to the array of lenses.

15. The apparatus according to claim 12, wherein the beam of radiation is projected onto a peripheral section of the array of lenses.

16. The apparatus according to claim 12, wherein:
the projection system comprises first and second projection systems corresponding to the beam of radiation and the patterned exposure beam, respectively; and
the array of lenses comprises first and second arrays of lenses, such that the first and second projection systems project the beam of radiation and the patterned exposure beam onto respective ones of the array of lenses.

17. The apparatus according to claim 12, further comprising:
an alignment scanning control system that controls scanning of a surface of the substrate with the beam of radiation and storing outputs from the detectors; and
an exposure control system that corrects the position of the substrate relative to the array of lenses during substrate exposure in dependence upon the stored outputs.

18. The apparatus according to claim 17, wherein the exposure control system:
compares a predetermined pattern of detector outputs corresponding to a pattern to be detected on the substrate with the stored detector outputs;
determines the position of the substrate relative to the lens array from the position relative to the array of lenses of a pattern which is the same as the predetermined pattern;
compares the determined position with a nominal position of the substrate; and corrects for any difference between the determined and nominal positions.

19. The apparatus according to claim 18, wherein the predetermined pattern comprises:
an array of features with a pitch equal to the pitch of lenses of the array of lenses associated with the detectors of the reflected light.

20. The apparatus according to claim 19, wherein the predetermined pattern comprises an array of spots.

21. The apparatus according to claim 19, wherein the predetermined pattern comprises an array of lines.

22. The apparatus according to claim 19, wherein the predetermined pattern comprises features with different spacings between adjacent features.

23. An optical position measuring method, comprising:
projecting an alignment beam from a projection system onto a target portion of a substrate;
moving at least one of the substrate and the projection system relative to the other; and
determining a position of at least a component of the projection system relative to the substrate, the determining step comprising,
illuminating an array of lenses arranged such that each lens in the array focuses a respective portion of the alignment beam onto a respective part of the target portion,
detecting light reflected from a previously formed portion of a feature on the substrate through each corresponding lens in the array on a corresponding detector and providing an output representative of a detected intensity of light reflected from the previously formed portion of the feature on the substrate through each corresponding lens, and
deriving data to be used for representing a position of the array of lenses relative to the substrate from the outputs, wherein a relative position of the projection system and the substrate is adjusted based on the derived data during exposure of a subsequently formed portion of the feature.

24. The method according to claim 23, further comprising:
using at least two sub-detectors for at least one detector; and
monitoring outputs of the sub-detectors to detect non-uniform illumination of at least one detector.

25. The method according to claim 23, further comprising:
arranging at least two detectors, such that only if a spacing between the substrate and associated lenses of the array corresponding to the at least two detectors is not correct will light reflected through the associated lenses be incident upon the at least two detectors; and
correcting the spacing between the substrate and the lens array so as to level the array of lenses relative to the substrate if light of a predetermined minimum intensity is incident upon any one of the at least two detectors.

26. The method according to claim 23, further comprising generating an exposing beam of radiation; and
projecting the exposing beam of radiation onto the substrate through the array of lenses.

27. The method according to claim 23, further comprising:
arranging at least one detector, such that only if a spacing between the substrate and an associated lens of the array of lenses is not correct will light reflected through the associated lens be incident upon the at least one detector and an incorrect spacing between the substrate and the lens array is indicated if light of a predetermined minimum intensity is incident upon the at least one detector.

28. The method according to claim 23, further comprising:
determining characteristics of regions of the substrate beneath the array of lenses from the detected intensities; and
deriving a measurement of a position of the substrate from the detected intensities to be used for adjusting the relative position of the substrate and the projection system.

29. The method according to claim 23, further comprising:
patterning an exposure beam.

30. The method according to claim 27, further comprising:
projecting a respective portion of the alignment beam onto a respective lens of the array of lenses through an opening defined in the at least one detector.

31. The method according to claim 28, further comprising:
deriving an intensity pattern corresponding to the detected intensities;
comparing the derived intensity pattern with a stored intensity pattern corresponding to an alignment pattern; and
determining the position of the substrate relative to the lens array from the position of lenses within the array of lenses to adjust the relative position of the substrate and the projection system.

32. The method according to claim 31, further comprising:
providing a fault-indicating output if no pattern is derived which is the same as the stored intensity pattern.

33. The method according to claim 29, further comprising:
generating the patterned exposure beam from an exposure illumination source; and
generating the alignment beam from an alignment illumination source, wherein the sources produce beams of different wavelengths.

34. The method according to claim 29, further comprising generating the patterned exposure beam and the alignment beam from a common source.

35. The method according to claim 33, further comprising:
projecting the alignment and patterned exposure beams using the projection system from the sources to the array of lenses.

36. The method according to claim 33, further comprising:
projecting the alignment and patterned exposure beams using first and second projection devices in the projection system from the sources to the array of lenses.

37. The method according to claim 33, further comprising:
projecting the alignment beam onto a peripheral section of the array of lenses.

38. The method according to claim 33, further comprising:
projecting the alignment and patterned exposure beams using separate devices in the projection system from the sources to the array of lenses.

39. The method according to claim 33, further comprising scanning a surface of the substrate with the alignment beam;
storing outputs from the detectors; and
controlling the position of the substrate relative to the array of lenses during substrate exposure based on the storing step.

40. The method according to claim 39, further comprising:
comparing a predetermined pattern of detector outputs corresponding to a pattern to be detected on the substrate to the stored detector outputs;
determining a position of the substrate relative to the array of lenses from the position relative to the array of lenses of a pattern which is the same as the predetermined pattern;
comparing the determined position to a nominal position of the substrate; and correcting a position of the substrate to compensate for any difference between the determined and nominal positions.

41. The method according to claim 40, further comprising:

forming the predetermined pattern to provide an array of features with a pitch equal to the pitch of lenses of the array of lenses associated with detectors of the reflected light.

42. The method according to claim 41, further comprising using an array of spots as the predetermined pattern.

43. The method according to claim 41, further comprising using an array of lines as the predetermined pattern.

44. The method according to claim 41, further comprising using features with different spacing between adjacent features as the predetermined pattern.

* * * * *